United States Patent [19]
Ozawa et al.

[11] Patent Number: 5,142,156
[45] Date of Patent: Aug. 25, 1992

[54] ALIGNMENT METHOD FOR PRINTING A PATTERN OF AN ORIGINAL ONTO DIFFERENT SURFACE AREAS OF A SUBSTRATE

[75] Inventors: Kunitaka Ozawa, Isehara; Shunichi Uzawa, Tokyo; Hirohisa Ohta, Kawasaki; Makiko Mori, Atsugi; Noriyuki Nose, Machida, all of Japan

[73] Assignee: Canon Kabushiki Kaisha, Tokyo, Japan

[21] Appl. No.: 588,947

[22] Filed: Sep. 27, 1990

[30] Foreign Application Priority Data

Sep. 29, 1989 [JP] Japan .................................. 1-252348

[51] Int. Cl.$^5$ ............................................ G01N 21/86
[52] U.S. Cl. ..................................... 250/548; 356/401
[58] Field of Search ...................... 250/548, 557, 561; 356/399, 400, 401

[56] References Cited

U.S. PATENT DOCUMENTS

| | | | |
|---|---|---|---|
| 4,662,753 | 5/1987 | Yabu | 250/548 |
| 4,677,301 | 6/1987 | Tanimoto et al. | 250/548 |
| 4,766,309 | 8/1988 | Kudo | 250/548 |
| 4,780,615 | 10/1988 | Suzuki | 250/548 |

Primary Examiner—David C. Nelms
Assistant Examiner—K. Shami
Attorney, Agent, or Firm—Fitzpatrick, Cella, Harper & Scinto

[57] ABSTRACT

An alignment method for use in an exposure apparatus for printing a pattern of an original onto different surface areas of a substrate, the alignment method comprising the steps of: providing alignment marks around the pattern of the original and placing the original on an original supporting stage; providing a reference mark on an X-Y stage for supporting the substrate and being movable in X and Y directions, and moving the X-Y stage so as to place the reference mark at those positions, in sequence, which correspond to the alignment marks of the original, respectively, and which are preset in respect to a stage coordinate system; detecting, in sequence, positional errors of the alignment marks of the original with respect to the corresponding set positions, respectively, by using the reference mark and through the movement of the X-Y stage, wherein the positional errors are detected by use of positional error detectors which are provided to be associated with the alignment marks of the original, respectively; calculating a rotational error of the original with respect to the stage coordinate system, in $\theta$ direction, by using the positional errors; and rotationally moving the original supporting table in the $\theta$ direction so as to correct the rotational error.

6 Claims, 10 Drawing Sheets

ALIGNMENT METHOD FOR PRINTING A PATTERN OF AN ORIGINAL ONTO DIFFERENT SURFACE AREAS OF A SUBSTRATE

FIELD OF THE INVENTION AND RELATED ART

This invention relates to an exposure apparatus for exposing a substrate such as a semiconductor wafer to an original such as a mask, wherein the original and the substrate are disposed opposed to each other.

In exposure apparatuses for manufacture of semiconductor integrated circuits, it is necessary to attain, before the exposure operation, high-precision registration (alignment) between a mask having an integrated circuit pattern formed thereon and a semiconductor wafer to which the circuit pattern is to be transferred. By way of example, in the case of an integrated circuit for a 256 megabit DRAM, the linewidth of the pattern is 0.25 micron order and, thus, a registration precision higher than 0.06 micron is required.

SUMMARY OF THE INVENTION

In conventional exposure apparatuses, it is not easy to attain high precision of alignment such as is described above.

Also, in conventional exposure apparatus, it is necessary to adjust both the coordinate system of a wafer stage and the coordinate system of a mask stage, with reference to the coordinate system of the main part (body) of the exposure apparatus. This necessarily results in the disadvantage of a complicated assembling and adjustment of these stage coordinate systems with reference to the coordinate system of the main body of the exposure apparatus.

Accordingly, it is an object of the present invention to provide an exposure apparatus in which higher precision alignment is attainable and in which the assembling and adjustment is easier.

In accordance with an aspect of the present invention to achieve this object, an X-Y stage for moving the substrate, to be exposed, is provided with a mark for alignment of the original. Any positional deviation between such mark on the X-Y stage and a plurality of alignment marks provided on the original, is measured. The position of the original is adjusted with respect to the coordinate system of the X-Y stage, on the basis of the position coordinate of the alignment marks of the original with respect to the X-Y stage coordinate.

In one preferred embodiment of the present invention, the original aligning mark on the X-Y stage is formed at a particular location, and the X-Y stage is moved sequentially so that the mark of the X-Y stage is sequentially placed at the positions below the alignment marks of the original, respectively. The amount of deviation between the mark of the X-Y stage and each mark of the original is measured to determine the X-Y coordinate of each alignment mark of the original. Also, of the positional deviation of the original with respect to the X-Y stage coordinate system, the $\theta$ component is corrected by moving the stage for the original. The amount of correction in the X and Y components is fed back, as a corrective quantity for the position coordinate of each shot area when the pattern of the original is to be printed on that shot area of the substrate.

In another preferred form of this invention, the alignment operation for the original includes a step of rough alignment only with regard to the $\theta$ component, using two of marks provided on the original, and a step of final alignment with regard to the X, Y and $\theta$ components, using two or more marks.

In conventional exposure apparatuses, the alignment of the original is executed with respect to the coordinate system of the main body of the exposure apparatus. Thus, if there is an error between the coordinate system of the substrate stage and the coordinate system of the main body of the apparatus, an error is produced between the direction of movement of the substrate stage and the direction of corrective drive as calculated from the deviation between the original and the substrate. Such an error adversely affects the alignment precision.

According to one aspect of the present invention, the original is aligned with respect to the coordinate system of the stage. Thus, the precision of relative position of the original and the substrate, to be exposed, can be improved.

Further, since the original is aligned with respect to the stage coordinate system, the effect of an error between the coordinate system of the substrate stage and the coordinate system of the main body of the apparatus, upon the alignment precision, is reduced, such that the assembling and adjustment of the main body of the apparatus and the stage coordinate is easier.

Further, the alignment of the original is executed by two steps of rough alignment with respect to the $\theta$ component and final or fine alignment with respect to the X, Y and $\theta$ components. This is effective to reduce the number of searching operations and, thus, effective to improve the throughput of the device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
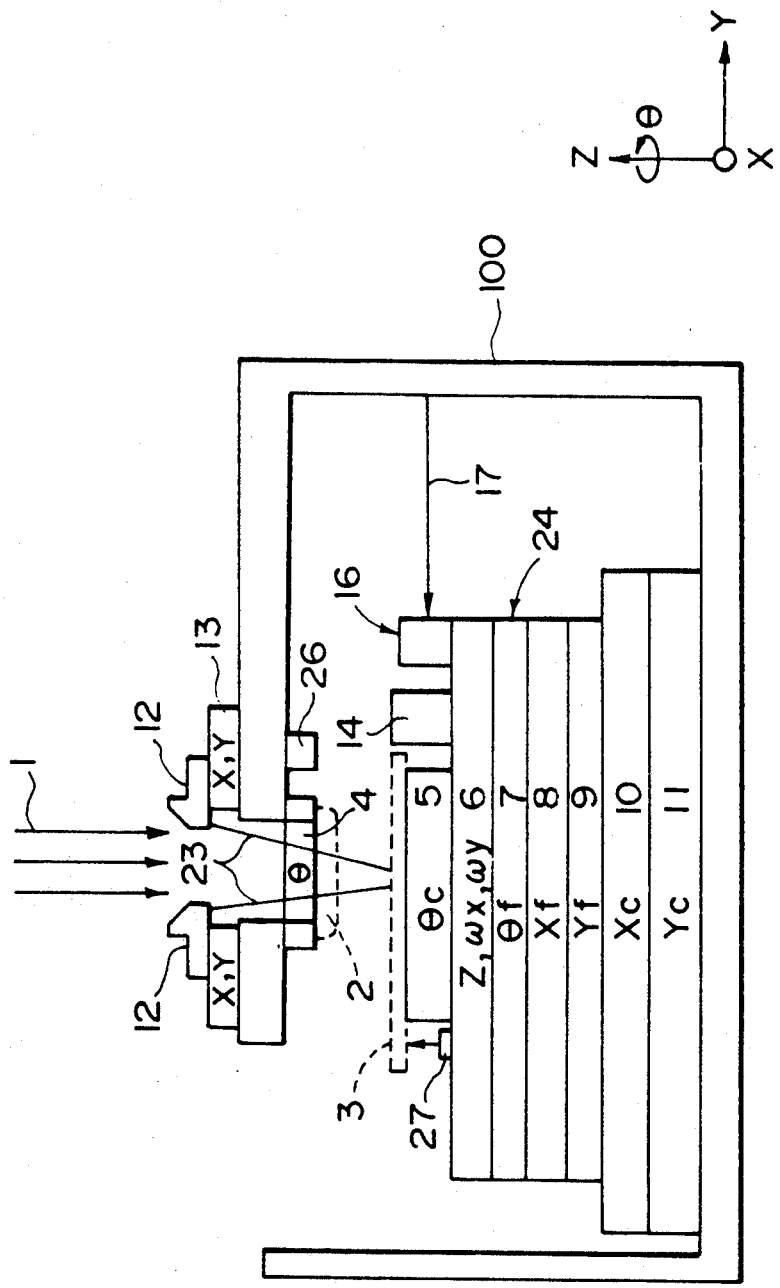
FIG. 1 is a schematic view showing a major part of a step-and-repeat type exposure apparatus according to an embodiment of the present invention.

FIG. 1 illustrates the structure of a part of a step-and-repeat type exposure apparatus (stepper) which pertains to the mask-to-wafer alignment and which is around an exposure stage. In FIG. 1, denoted at 1 is light for exposure (photoprinting) which is projected substantially along the Z-axis direction and which comprises X-rays contained in a synchrotron orbit radiation (SOR), for example. Denoted at 2 is a mask having formed thereon a pattern which is to be transferred onto a semiconductor wafer 3. Denoted at 4 is a mask $\theta$ stage for rotationally moving the mask 2 along a plane (X-Y plane) parallel to the surface thereof; and denoted at 5 is a $\theta$ rough-motion stage for rotationally moving the wafer 3 along a plane (X-Y plane) parallel to the surface thereof. Denoted at 6 is a Z tilt stage which is effective to move the wafer 3 in the Z direction (movement toward the exposure light 1), in the wx direction (rotation about the X axis) and in the wy (rotation about the Y axis), respectively, when the wafer 3 is to be opposed to the mask 2 with a predetermined proximity gap in the Z-axis direction. Denoted at 7 is a $\theta$ fine-motion stage for minutely rotating the wafer 3 in the X-Y plane; denoted at 8 is an X fine-motion stage for minutely moving the wafer in the X direction; at denoted 9 is a Y fine-motion stage for minutely moving the wafer in the Y direction; denoted at 10 is an X rough-motion stage; and denoted at 11 is a Y rough-motion stage. The $\theta$ rough-motion stage 5, the Z tilt stage 6, the $\theta$ fine-motion stage 7, the X rough-motion stage 10 the Y fine-motion stage 9, the X rough-motion stage 10 and the Y rough-motion stage 11, cooperate with each other to provide a wafer stage 24.

Denoted at 12 are pickups which are adapted to project light to alignment marks formed on the mask 2 and the wafer 3 and which are adapted to detect scattered light from these marks.

Figures 2A, 2B:
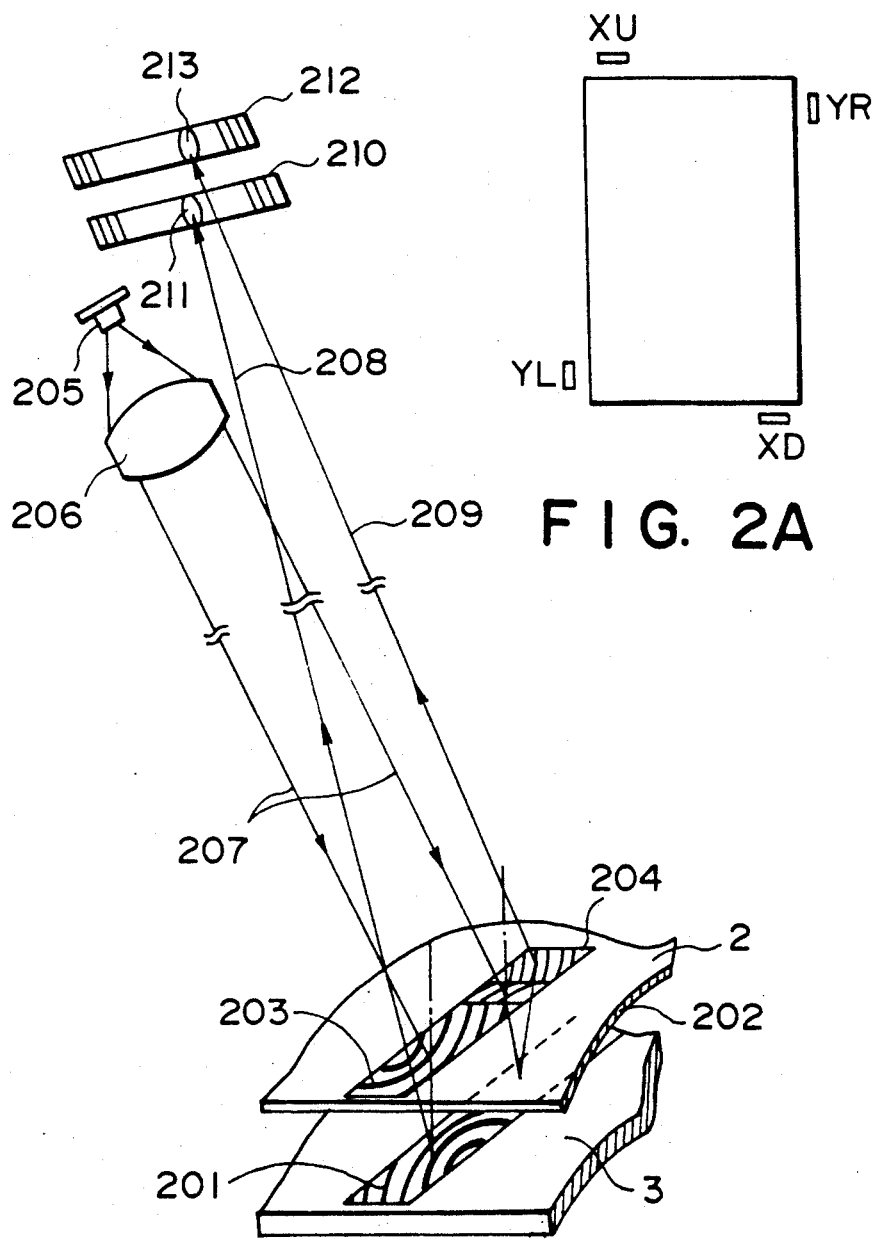
FIGS. 2A and 2B are schematic views, respectively, for explaining wafer alignment marks and mask alignment marks.

In this embodiment, as best seen in FIG. 2A, four alignment marks XU, XD, YL and YR are formed on scribe lines of each shot area of the wafer 3, each mark being disposed closed to an end of corresponding sides of that shot area.

Each alignment mark comprises a diffraction grating, as shown in FIG. 2B, which provides an autoalignment (AA) mark 201 adapted to detect an error in the mask-to-wafer registration with respect to a direction which is parallel to the side at which that alignment mark is formed, as well as an autofocusing (AF) mark 202, for detection of the spacing between the mask 2 and the wafer 3. The alignment mark has been formed on the wafer together with a semiconductor circuit pattern, in the preceding process. Also, the mask 2 is provided with four alignment marks (203, 204) associated with the alignment marks of the wafer 3, respectively, which mask alignment marks are formed of gold, for example, together with a semiconductor circuit pattern which is to be transferred to the wafer (see FIG. 10A).

In FIG. 2B, denoted at 205 is a semiconductor laser (light emitting element); denoted at 206 is a collimator lens for transforming the light emitted by the semiconductor laser 205 into a parallel light; denoted at 207 is the light beam emitted by the semiconductor laser 205 and transformed by the collimator lens 206 into the parallel light; denoted at 208 is an autoalignment (AA) light beam, to be received, which bears positional deviation information (AA information) given by a optical system constituted by the AA mark 201 of the wafer and the AA mark 203 of the mask; and denoted at 209 is an autofocusing (AF) light beam, to be received, which bears gap information (AF information) given by an optical system constituted by the AF mark 202 of the wafer and the AF mark 204 of the mask. Denoted at 210 is an autoalignment (AA) sensor for converting the position of an autoalignment (AA) light spot 211, formed by the AA light beam 208, into an electric signal (AA information). For example, the sensor 210 comprises a line sensor such as a CCD array. Denoted at 212 is an autofocusing (AF) sensor for converting the position of an autofocusing (AF) light spot 213, formed by the AF light beam 209, into an electric signal (AF information). For example, the sensor 212 comprises a line sensor such as a CCD array.

Referring back to FIG. 1, denoted at 14 is a mask aligning reference mark provided on the wafer stage 24 for alignment between the mask 2 and the wafer stage 24. This reference mark 14 comprises four mark elements corresponding to the four alignment marks provided on the mask 2. Denoted at 16 is a super flat mirror; and at 17 is a Y-measurement beam and $\theta$-measurement beam which is projected to and reflected by the mirror 16, for measurement of the amount of displacement of the wafer stage 24 in the Y direction as well as the inclination $\theta$ thereof about the Z axis. By using these beams and an X-measurement beam (not shown), the position (X, Y, $\theta$) of the wafer stage 24 with respect to the stage coordinate system can be measured through an interferometer.

Denoted at 100 is a main body frame to which the mask $\theta$ stage 4 and the wafer stage 24 as well as the pickups 12 are mounted.

Figure 3:
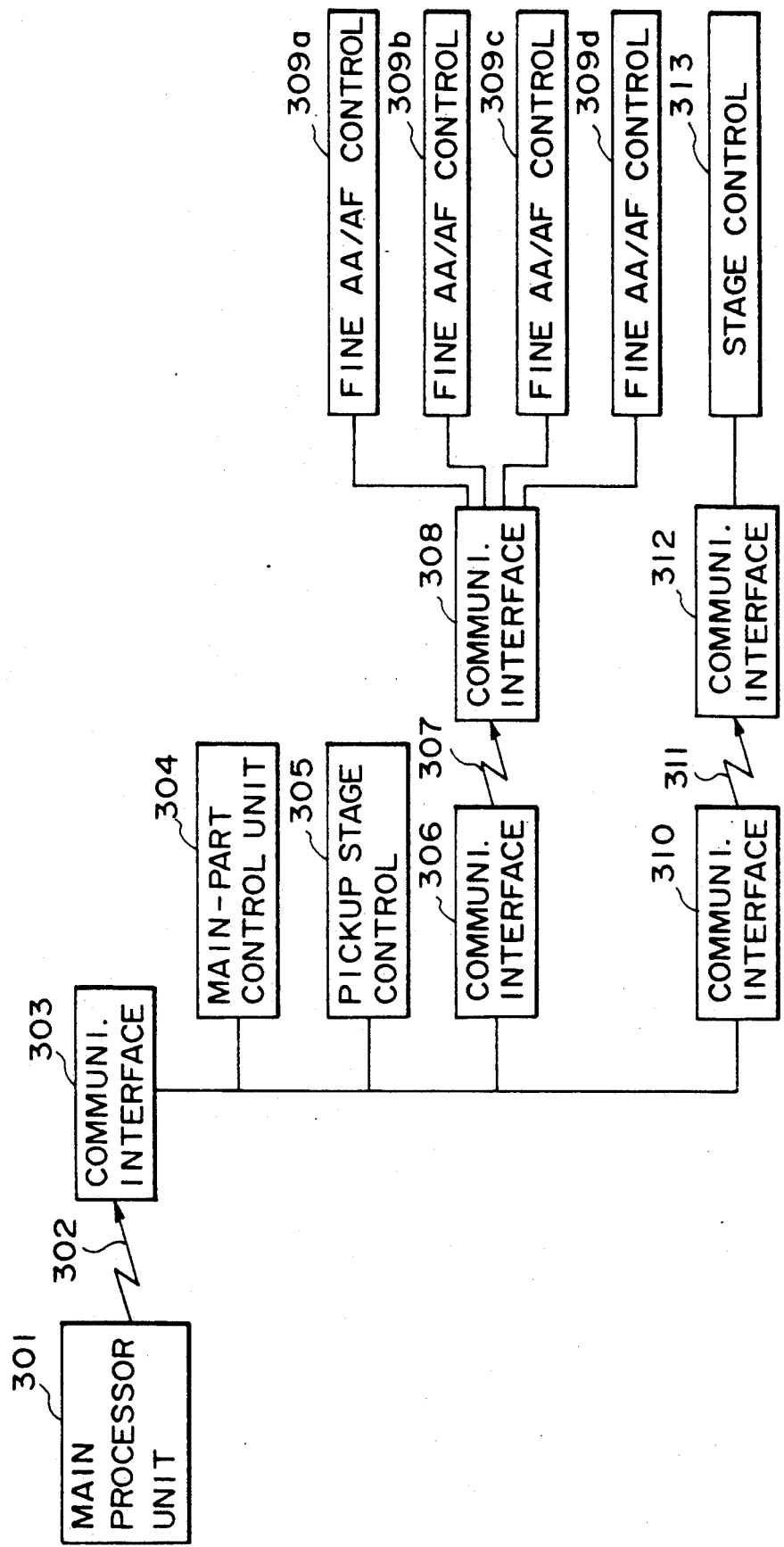
FIG. 3 is a block diagram, illustrating the hardware of a control system of the exposure apparatus of FIG. 1.

FIG. 3 illustrates the structure of a control system of the exposure apparatus of FIG. 1. While not shown in the drawings, the exposure apparatus of FIG. 1 is equipped with a mirror unit for expanding the flux of X-rays, emitted from a SOR in the form of a horizontal sheet-like beam, in the vertical direction to provide an area beam; a main part unit which includes an alignment unit for aligning the mask and the wafer and an exposure unit for exposing the aligned mask and the wafer with the area X-ray beam; an attitude control unit for controlling the attitude of each of the mirror unit and the main-part unit; as well as a chamber and air conditioning unit for controlling the ambience around the mirror unit and the main-part unit.

In FIG. 3, denoted at 301 is a main processor unit for controlling the operation of the apparatus as a whole; denoted at 302 is a communication line for communicating the main processor unit 301 with the main-part unit; denoted at 303 is a main-part side communication interface; denoted at 304 is a main-part control unit; and denoted at 305 is a pickup stage control means. Denoted at 306 and 308 are communication interfaces and denoted at 307 is a communication line, all of which are adapted to communicate, in the main-part unit, the main-part control unit 304 with fine AA/AF control means 309a, 309b, 309c and 309d for measurement of mark positional deviation for the purpose of mask alignment and mask-to-wafer alignment. Denoted at 310 and 312 are communication interfaces and denoted at 311 is a communication line all of which are adapted to communicate, in the main-part unit, the main-part control unit 304 with a stage control means 313 which controls the alignment corrective drive and the stepwise movement.

Figure 4:
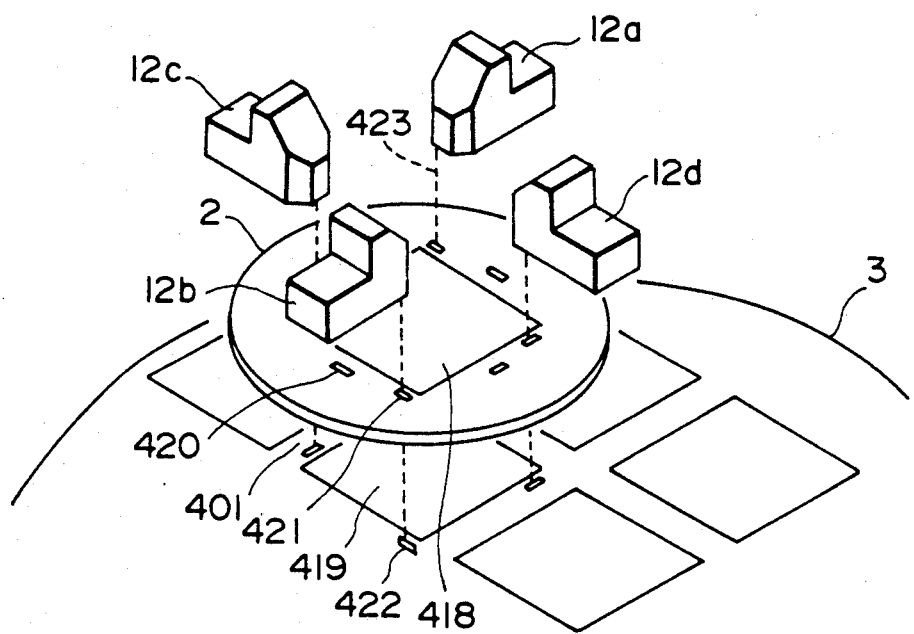
FIG. 4 is a schematic view, for explaining the step-and-repeat exposure method.

FIG. 4 illustrates the step-and-repeat exposure method. For simplicity in illustration, as compared with FIG. 1, illustration of the mask θ stage 4 which is driving means for the mask 2, the wafer stage 24 which is driving means for the wafer 3 and the pickup stage 13 which is driving means for the pickup 12, is omitted in FIG. 4.

In FIG. 4, denoted at 12 (12a–12d) are pickups for aligning the mask 2 and the wafer 3; denoted at 418 is a pattern (to be transferred) formed on the mask; denoted at 419 is a pattern, transferred, having been formed on the wafer in the preceding process; denoted at 420 are alignment marks for mask alignment, to be used for aligning the mask 2 with a reference mark 14 (FIG. 1) provided on the wafer stage 24; denoted at 421 are alignment marks formed on the mask, for aligning the mask pattern 18 with the transferred pattern 419; denoted at 422 are alignment marks formed on the wafer for the same purpose; denoted at 423 are projected light beams, projected from the pickups 12 for the same purpose; and denoted at 401 are scribe lines defined between shot areas. The alignment marks 421 and 422 of the mask and the wafer are formed on these scribe lines.

As regards the alignment marks 420 on the mask, there are four marks which are provided at the middles of the four sides of the mask pattern 418, corresponding to the scribe lines 401 of the wafer defined between adjacent shot areas. The mask marks 420 for exclusive use of alignment may be omitted and the alignment marks 421 of the mask for the mask-to-wafer alignment may be used also for the mask alignment.

In the apparatus of FIG. 1, the mask 2 can be aligned with the coordinate system (stage coordinate system) of the wafer stage 24 in the following manner: First, the wafer stage 24 is moved successively to place, in sequence, the alignment reference mark 14 of the wafer sage 24 at a position (measuring position) aligned with each mask mark 420 (or 421), and each time the wafer stage 24 is positioned the light beam 423 is projected from corresponding pickup 12 (12a–12d) having been moved to the corresponding mask mark, to measure relative positional deviation between the reference mark 14 and the corresponding mask mark in respect to the X and Y directions. By using the positional deviation information of these four mask marks, at the respective measuring position, and by using the amount of movement of the wafer stage 24 to each measuring position, errors $\Delta X$, $\Delta Y$ and $\Delta \theta$ of the mask marks with respect to the stage coordinate system are calculated. Then, as regards the θ component ($\Delta \theta$), the mask θ stage 4 is driven to reduce the θ error into its tolerance which is predetermined. Also, as regards the X component ($\Delta X$) and the Y component ($\Delta Y$), the calculated values are fed back to the position coordinate of each shot area (i.e. the amount of movement of the wafer stage 24 to be made for moving the wafer 3 to the respective shot positions).

The mask 2 and the wafer 3 can be aligned with each other in the following manner: first, under the condition that the mask 2 and the wafer 3 are supported to be opposed to each other, the pickups 12a–12d project light beams 423 and, through the corresponding alignment marks 421 and 422 of the mask and the wafer, the gap between the mask and the wafer is measured. On the basis of the information obtained from the four pickups, the amount of gap correcting drive is calculated and the wafer stage 24 is driven to set the gap between the mask and the wafer in respect to the z-axis direction, to be equal to the gap for exposure.

Subsequently, the pickups 12a–12d project light beams 423 again, and deviation between paired alignment marks 421 and 422 of the mask and the wafer, along a plane parallel to the surface of the mask or wafer, is measured. On the basis of the information obtained from the four pickups, the amount of corrective drive of that shot area as a whole is calculated, and the mask θ stage 4 and the wafer stage 24 are driven to bring the mask pattern 418 and the wafer pattern 419 into alignment with each other. After the alignment is attained, the exposure operation is effected, whereby the mask pattern 418 is transferred onto the wafer 3. Thereafter, the wafer stage 24 is driven so that the next shot area comes to a position below the mask. In a similar manner, the alignment and exposure operation is repeated, whereby exposures of all the shot areas are effected.

Figure 5:
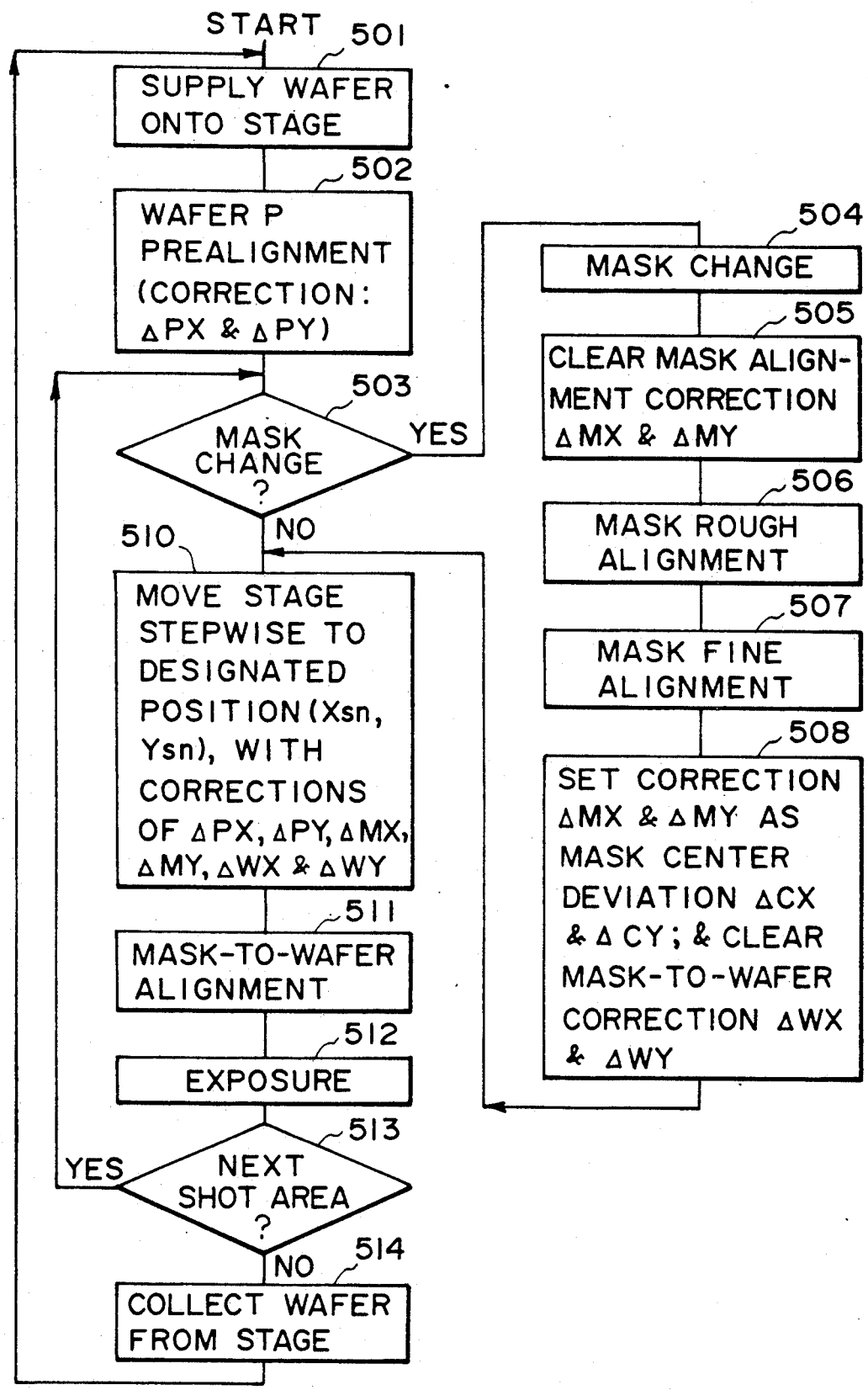
FIG. 5 is a flow chart, illustrating the flow corresponding to one patch of the step-and-repeat exposure sequence.

FIG. 5 is a flow chart, illustrating the flow of the step-and-repeat exposure sequence.

First, at step 501, a wafer is supplied to the wafer stage 24, and the supplied wafer is chucked to the wafer stage 24. At step 502, the wafer stage 24 is moved and two alignment marks of the wafer 2 are measured through a prealignment optical system (not shown), and the prealignment of the wafer 2 is executed. Here, the prealignment correction quantities $\Delta Px$ and $\Delta Py$ are memorized.

First, at step 503, discrimination is made as to the necessity of mask replacement. If the exposure is to be effected by using the mask which is being chucked at this time, the sequence goes to step 510. If the mask is to be replaced by another, the sequence goes to step 504.

At step 504, the current mask is demounted from the mask stage 4, by using a mask traverser (not shown) and the demounted mask is stored into a mask cassette (not shown). Then, a mask to be used for the exposure is taken out of its mask cassette by using the mask traverser and it is chucked to the mask stage 4.

Then, at step 505, the mask alignment correction quantities $\Delta MX$ and $\Delta MY$ having been memorized in a memory, are cleared. At step 506, mask rough alignment is effected by using two (YR and YL) of the four alignment marks 421 formed on the mask 2.

Figure 6:
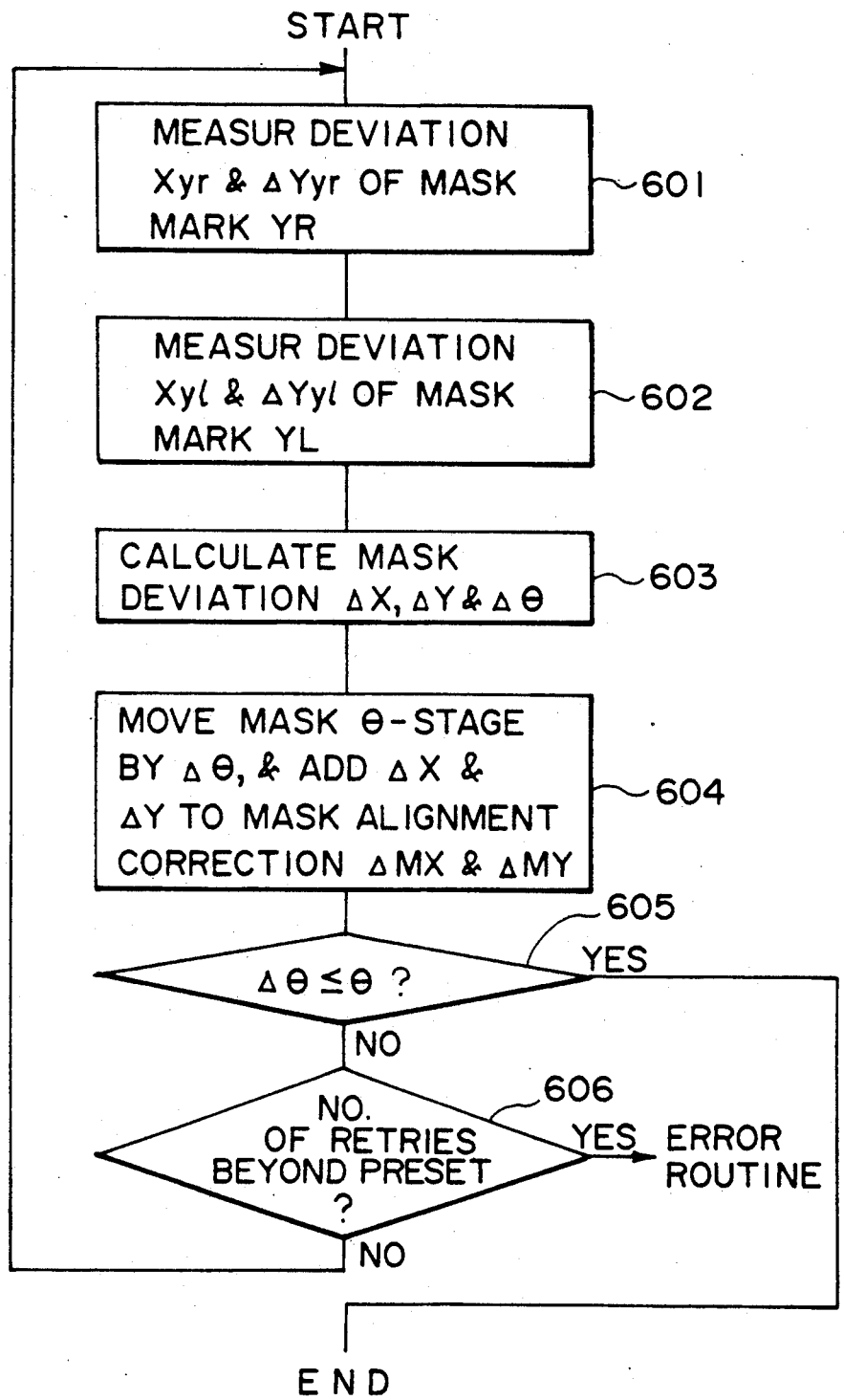
FIG. 6 is a flow chart, illustrating details of the mask rough alignment operation to be made at step 506 of FIG. 5.

FIG. 6 illustrates details of the mask rough alignment operation.

In FIG. 6, at step 601, an alignment mark (reference mark 14) of the wafer stage 24 is used to measure the positional deviation ($\Delta Xyr$ and $\Delta Yyr$) of the mark YR of the mask alignment marks 421, with respect to the reference mark 14.

Figure 7:
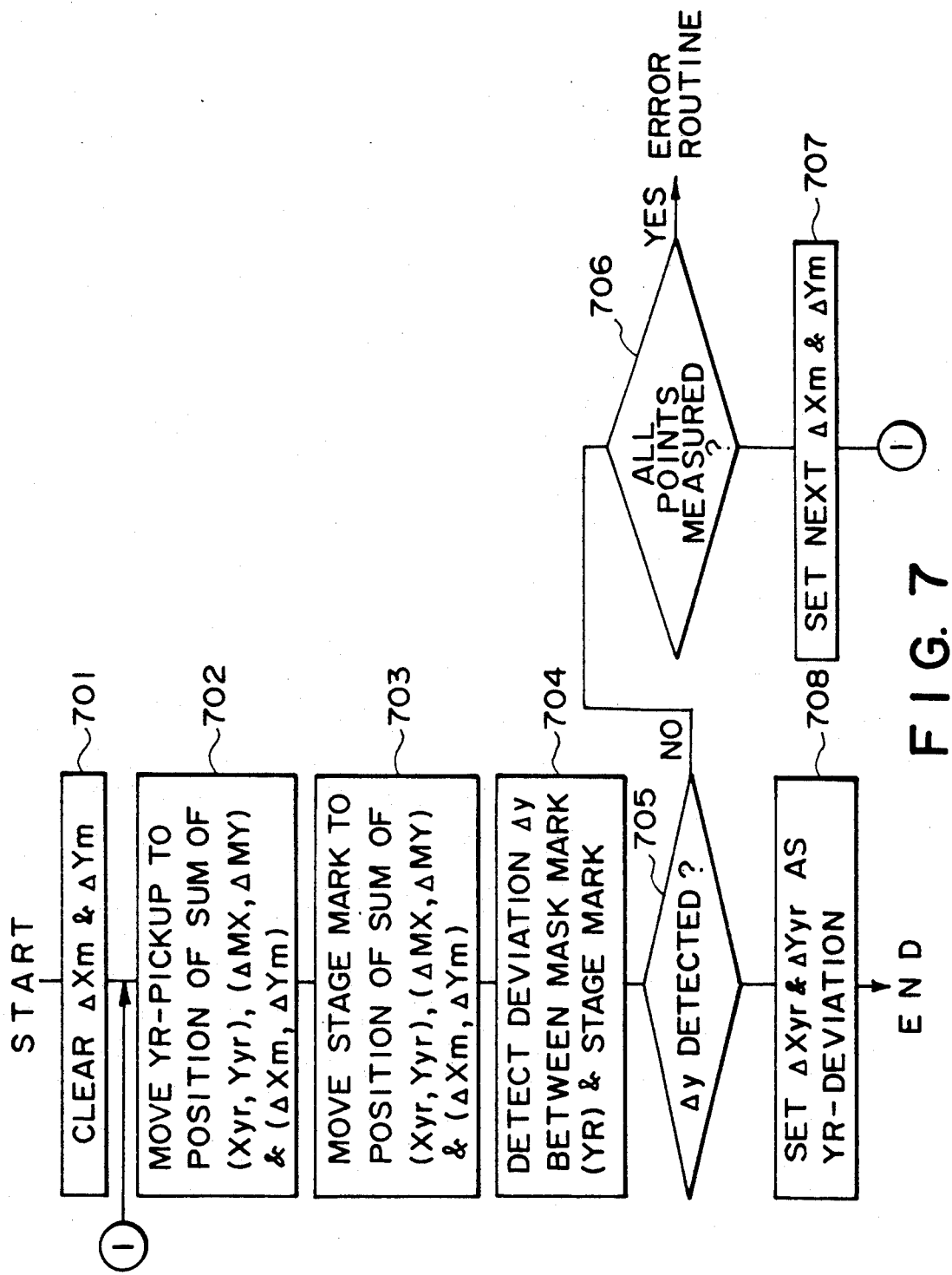
FIG. 7 is a flow chart, illustrating details of the mask rough alignment mark measuring operation to be made at step 601 of FIG. 6.

FIG. 7 illustrates details of the mask rough alignment mark measuring operation, made at step 601 of FIG. 6.

In FIG. 7, at step 701, the quantities $\Delta Xm$ and $\Delta Ym$ of searching movement having been memorized in the memory are cleared. Then, at step 702, the pickup 12 for measurement of the mark YR (hereinafter, this pickup will be referred to as "YR pickup") is moved to the position which corresponds to the sum of the stage coordinate (Xyr, Yyr) of the mask YR mark 421, the mask alignment correction quantities ($\Delta MX$ and $\Delta MY$) and the searching movement quantities ($\Delta Xm$ and $\Delta Ym$). Here, the stage coordinate means the design position coordinate or the position coordinate, actually measured by using a sample, in the stage coordinate system of the mask YR mark 421, for example, and the stage coordinate of each mark or each shot area is set prior to the exposure step.

At step 703, the wafer stage 24 is moved to place the alignment mark (reference mark) 14 thereof at the position which corresponds to the sum of the stage coordinate (Xyr, Yyr) of the mask YR mark 421, the mask alignment correction quantities ($\Delta MX$ and $\Delta MY$) and the searching movement quantities ($\Delta Xm$ and $\Delta Ym$). Subsequently, at step 704, relative deviation $\Delta by$ between the mask YR mark 421 and the alignment mark 14 of the stage is measured through the YR pickup 12 and the sequence goes to step 705.

At step 705, a discrimination is made as to whether the measurement of the deviation $\Delta y$ has been attained or not. If not, the sequence goes to step 706 whereat discrimination is made as to whether the measurement to all the points at the searching position has been completed or not. If not, the sequence goes to step 707 wherein the quantities $\Delta Xm$ and $\Delta Ym$ for the next searching movement are set. After this, the flow goes back to step 702, and the operations at step 702 and steps following it are repeated. If the result of the discrimination at step 706 is affirmative, which means failure of the YR mark measurement, the sequence goes to an error routine, whereby the exposure processing is stopped or, alternatively, an alarm or display of error is provided. Also, if the result of the discrimination at step 705 is affirmative, the flow goes to step 708 wherein the quantities $\Delta Xm$ and $\Delta Y + \Delta Ym$ are memorized as the positional deviation ($\Delta Xyr$ and $\Delta Yyr$) of the mask YR mark 421 and, thereafter, the mask rough alignment mark measuring operation is completed and the sequence goes to step 602 in FIG. 6.

At step 602 in FIG. 6, positional deviation ($\Delta Xyl$ and $\Delta Yyl$) of the mask YL mark is measured in the same manner as at step 601, except for that the mark YL of the mask is used as the mask mark 421 and the YL pickup 12 is used as the corresponding pickup 12.

Then, at step 603, the positional deviation ($\Delta X$, $\Delta Y$ and $\Delta \theta$) of the mask 2 is calculated on the basis of the detected positional deviation quantities $\Delta Xyr$ and $\Delta Yyr$ of the mask YR mark and of the detected positional deviation quantities $\Delta Xyl$ and $\Delta Yyl$ of the mask YL mark. Then, at step 604, the mask $\theta$ stage 4 is driven by an amount corresponding to the deviation $\Delta \theta$ while, on the other hand, the determined positional deviation quantities $\Delta X$ and $\Delta Y$ are added to the mask alignment correction quantities $\Delta MX$ and $\Delta MY$. After this, the sequence goes to step 605 at which a discrimination is made as to whether the mask positional deviation $\Delta \theta$ is within the tolerance of the rough alignment. If it is not within the tolerance, the sequence goes to step 606 in which the mask rough alignment operation counter is incremented and whether or not the counted number is beyond a preset number of retries, is discriminated. If the counted number is larger than the preset number, which means failure of mask $\theta$ rough alignment in spite of retries of a predetermined number, the sequence goes to an error routine wherein the exposure processing is stopped or, alternatively, an alarm or display of error is provided. If the counted number is smaller than the set number of retries, the flow goes back to step 601 and the $\theta$ rough alignment operation at step 601 and step following it is retried.

If the result of discrimination at step 605 is affirmative, the mask rough alignment operation is completed and the sequence goes to step 507 in FIG. 5.

At step 507 in FIG. 5, the reference mark 14 of the wafer stage 24 and four alignment marks 421 (XU, XD, YL and YR) of the mask 2 are used to execute the mask fine alignment.

Figure 8:
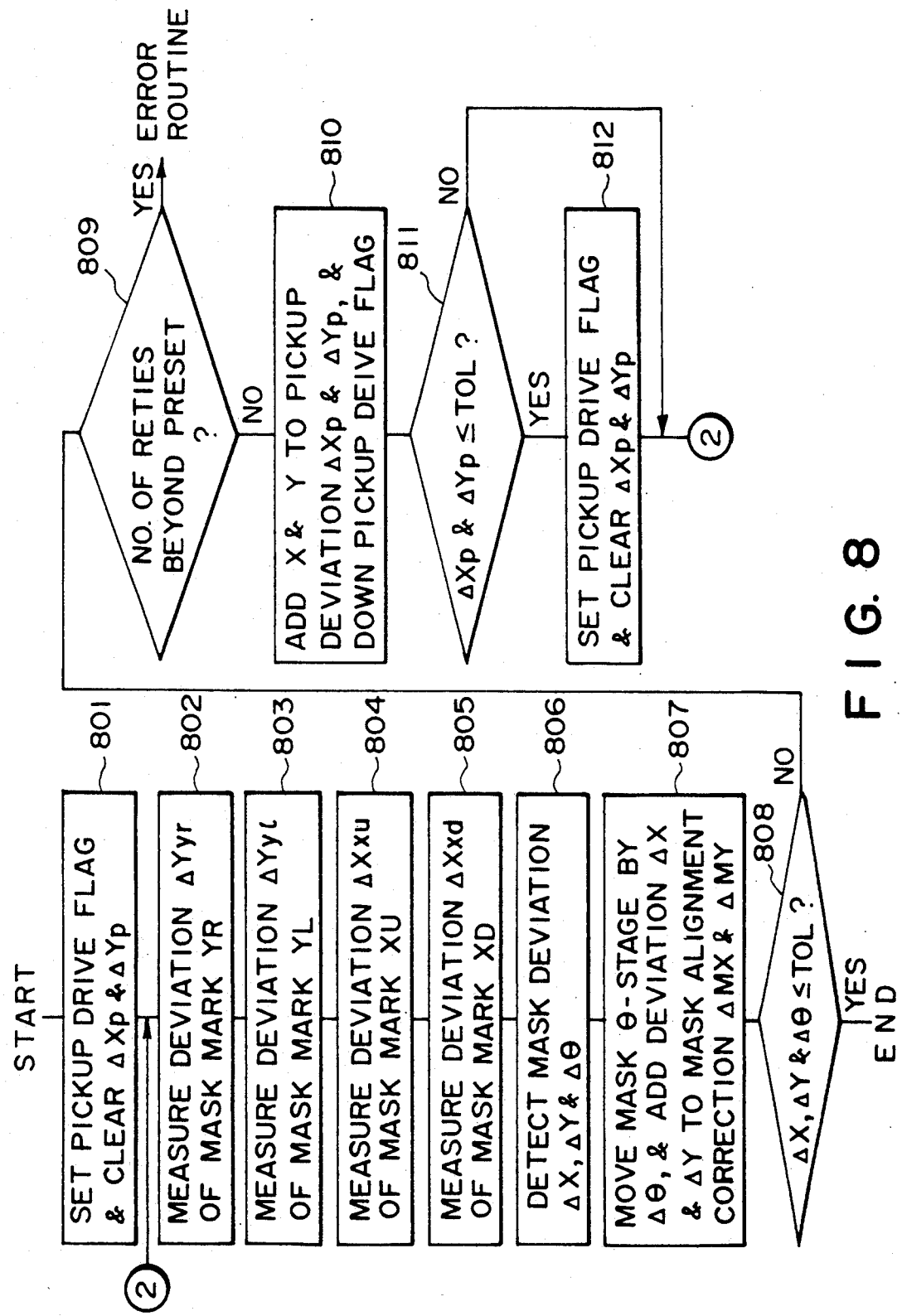
FIG. 8 is a flow chart, illustrating details of the mask fine alignment operation to be made at step 507 of FIG. 5.

FIG. 8 illustrates details of the mask fine alignment operation.

In FIG. 8, at step 801, the pickup drive designation flag is set, and the quantities $\Delta Xp$ and $\Delta Yp$ of the pickup deviation are cleared. Then, at step 802, the alignment mark 14 of the wafer stage 24 is used to measure the positional deviation $\Delta Yyr$ of the mark YR which is one of the alignment marks 421 of the mask.

Figure 9:
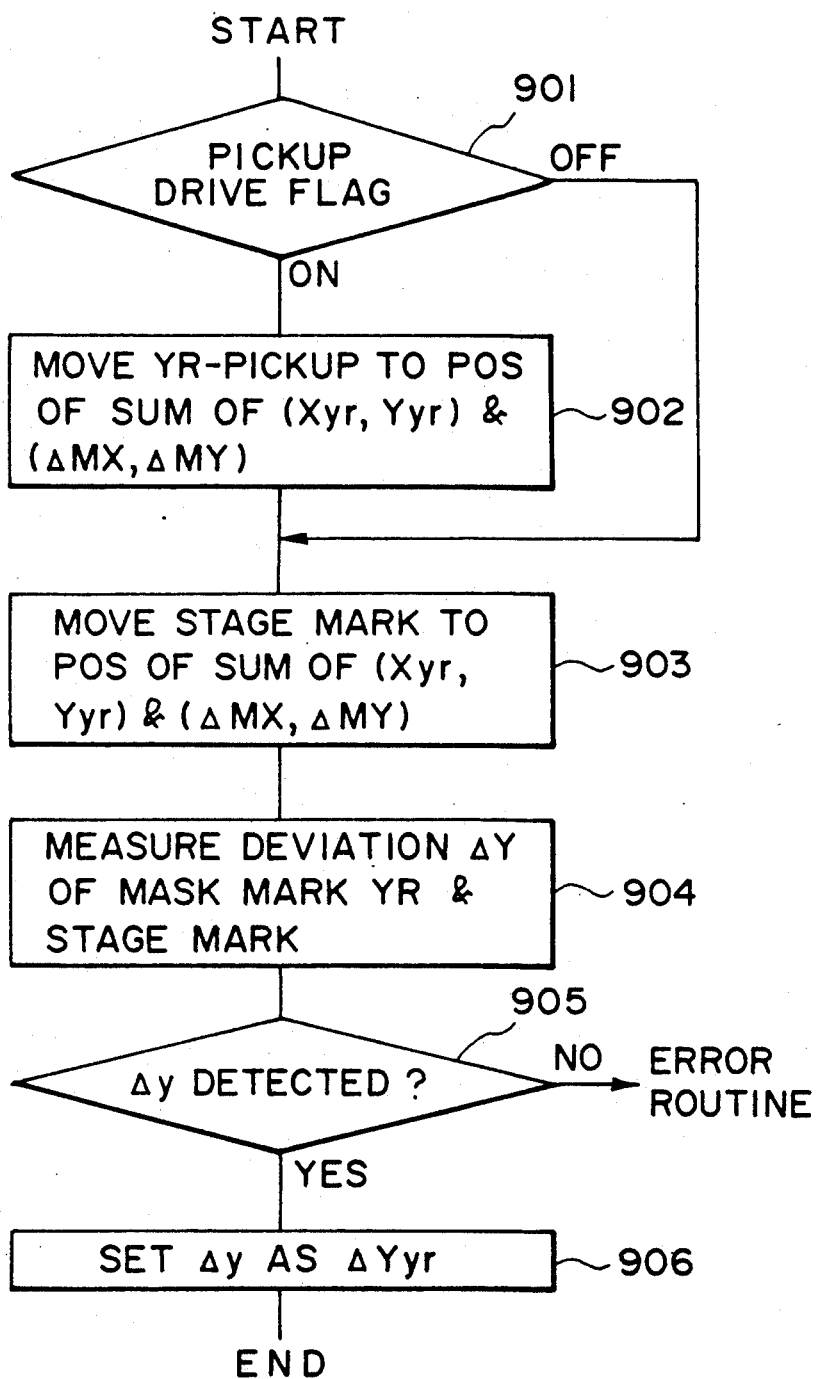
FIG. 9 is a flow chart, illustrating details of the mask fine alignment mark measuring operation to be made at step 802 of FIG. 8.

FIG. 9 illustrates details of the mask fine alignment mark measuring operation to be made at step 802 in FIG. 8.

In FIG. 9, at step 901, the pickup drive designation flag is checked. If it has been set, at step 902 the YR pickup 12 is moved to the position which corresponds to the sum of the stage coordinate (Xyr, Yyr) of the mask YR mark 421 and the mask alignment correction quantities $\Delta MX$ and $\Delta MY$ having been memorized in the preceding operation. Then, the sequence goes to step 903. If, on the other hand, the pickup drive designation flag has not been set, the processing at step 902 is skipped, and the flow goes directly to step 903 from step 901.

At step 903, the wafer stage is moved to place the alignment mark 14 thereof at the position which corresponds to the sum of the stage coordinate (Xyr, Yyr) of the mask YR mark 421 and the mask alignment correction quantities $\Delta MX$ and $\Delta MY$. Then, at step 904, positional deviation $\Delta y$ between the mask YR mark 421 and the alignment mark 14 of the stage, is measured through the YR pickup 12. Then, at step 905, discrimination is made as to whether the measurement of the deviation $\Delta y$ has been attained or not. If not, which means failure of correct execution of the YR mark rough alignment operation (step 506 in FIG. 5), the sequence goes to an error* routine whereby the exposure processing is stopped or, alternatively, an alarm or display of error is provided. If the result of discrimination at step 905 is affirmative, then the flow goes to step 906 in which the quantity $\Delta y$ is set as the positional deviation $\Delta Yyr$ of the YR mark 421 and, after this, the mask fine alignment mark measuring processing is finished and the flow goes to step 803 in FIG. 8.

At step 803 in FIG. 8, positional deviation $\Delta Yyl$ of the mask mark YL is measured in the same manner as at step 802, except for that the mask mark YL is used as the mask alignment mark 421 and the YL pickup is used as the pickup 12. Then, at step 804 and at step 805, in the same manner as at step 802 and at step 803, positional deviation $\Delta Xxu$ of the mask mark XU and positional deviation $\Delta Xxd$ of the mask mark XD are measured.

Then, at step 806, the quantities $\Delta X$, $\Delta Y$ and $\Delta \theta$ of positional deviation of the mask 2 with respect to the X-Y coordinate system of the stage 24 are calculated on the basis of the detected positional deviation quantities $\Delta Yyr$, $\Delta Yyl$, $\Delta Xxu$ and $\Delta Xxd$ of the respective marks. Then, at step 807, the mask $\theta$ stage 4 is driven by an amount corresponding to the positional deviation $\Delta \theta$ while, on the other hand, the quantities $\Delta X$ and $\Delta Y$ are added to the mask alignment correction quantities MX and MY. Then, the sequence goes to step 808 in which discrimination is made as to whether the mask positional deviation ($\Delta X$, $\Delta Y$ and $\Delta \theta$) is within the tolerance for mask alignment or not. If not, the flow goes to step 809 whereat discrimination is made as to whether the number of times of the mask fine alignment operation is larger than a preset number of retries or not. If the result is affirmative, which means failure of mask fine alignment in spite of execution of a predetermined number of retries, the sequence goes to an error routine whereby the exposure processing is stopped, or alternatively, an alarm or display of error is provided. If the number is not larger than the set number of retries, the sequence goes to step 810 in which the positional deviation quantities ΔX and ΔY are added to the pickup deviation quantities ΔXp and ΔYp, and the pickup drive designation flag is turned off. After this, the flow goes to step 811 at which a discrimination is made as to whether the pickup deviation (ΔXp and ΔYp) is within the tolerance or not. If not, the flow goes to step 812 and the pickup drive designation flag is set, while the quantities ΔXp and ΔYp of the pickup deviation are cleared. After this, the flow goes back to step 802 and the operations at step 802 and steps following it are repeated. This ensures that, when the mask fine alignment mark measuring operation at steps 802, 803, 804 and 805 (details are illustrated in FIG. 9) is subsequently to be executed, the pickup 12 is moved to catch the center of the mask mark 421. Thus, the precision of the mask fine alignment operation can be improved. If, on the other hand, the result of discrimination at step 811 is affirmative, the processing at step 812 is skipped and the flow goes directly back to step 802 from step 811.

If the result of discrimination at step 808 is affirmative, the mask fine alignment operation is finished and the sequence goes to step 508 in FIG. 5.

Figure 10A:
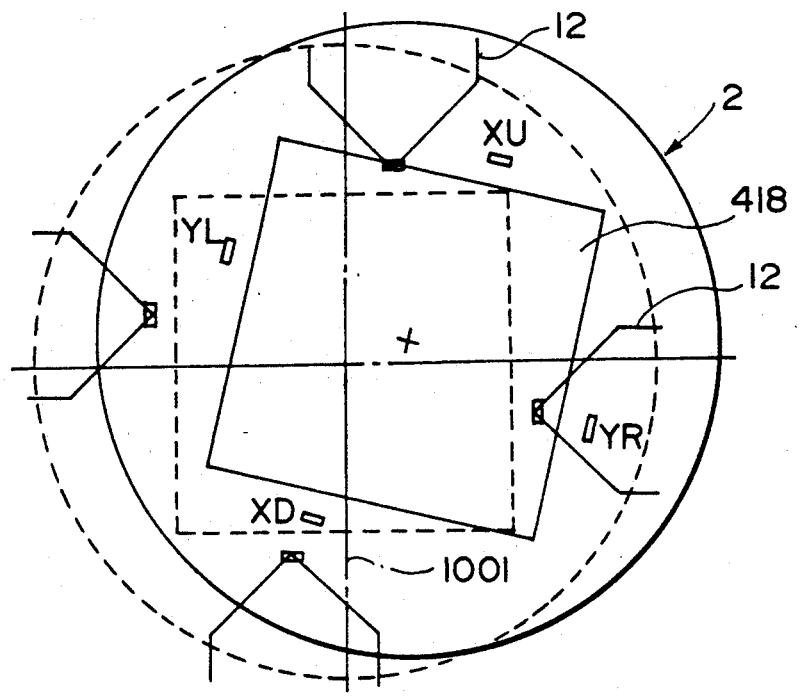
FIGS. 10A and 10B are schematic views, respectively, for explaining the mask alignment operation.
Figure 10B:
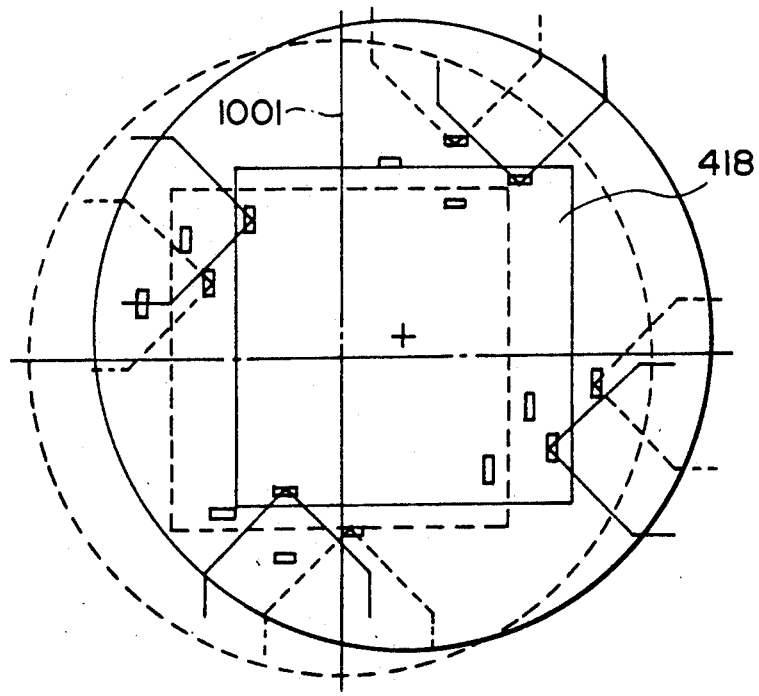

At step 508 in FIG. 5, the mask alignment correction quantities ΔMX and ΔMY are set as the quantities ΔCX and ΔCY of the mask center deviation, while the correction quantities ΔWX and ΔWY of the mask-to-wafer realignment are cleared. After this, the flow goes to step 510. With the above-described mask alignment operation, the mask 2 having been set with deviation with respect to the stage coordinate system 1001 such as shown in FIG. 10A, can be aligned with the stage coordinate system such as shown in FIG. 10B.

At step 510, the wafer stage 24 is moved stepwise to the position having such coordinate as obtainable by correcting the preset coordinate (Xsn, Ysn) of the shot area in accordance with the prealignment correction quantities ΔPX and ΔPY, the mask alignment correction quantities ΔMX and ΔMY, and the mask-to-wafer alignment correction quantities ΔWX and ΔWY. Then, at step 511, the mask-to-wafer alignment is executed by using the wafer alignment marks 422 (YR, YL, XU and XD) and the mask alignment mark 421 (YR, YL, XU and XD). The correction quantities in the X and Y directions as assumed when the mask-to-wafer alignment is effected, are equal to the quantities ΔWX and ΔWY, and these quantities change with the alignment operation to each shot area. After the subsequent exposure operation to the shot area at step 512, the flow goes to step 513.

At step 513, a discrimination is made as to whether there remains an unexposed shot area on the same wafer. If it remains, the sequence goes back to step 503 and the above-described operations at step 503 and steps following it are repeated. If it does not remain, the sequence goes back to step 501, and after the wafer replacement, the above-described operations at step 502 and steps following it are repeated.

While the invention has been described with reference to the structures disclosed herein, it is not confined to the details set forth and this application is intended to cover such modifications or changes as may come within the purposes of the improvements or the scope of the following claims.

What is claimed is:

1. An alignment method for use in an exposure apparatus for printing a pattern of an original onto different surface areas of a substrate, said alignment method comprising the steps of:

providing alignment marks around the pattern of the original, and placing the original on an original supporting stage;

providing a reference mark on an X-Y stage for supporting the substrate, and moving the X-Y stage to place the reference mark at those positions, in sequence, which are preset in correspondence to selected ones of the alignment marks, to thereby execute first detection for detecting positional errors, in sequence, of the selected alignment marks with respect to the corresponding preset positions, respectively;

calculating a rotational error, in a $\theta$ direction of the original with respect to a stage coordinate system by using the positional errors, and executing first correction for rotationally moving the original supporting stage in the $\theta$ direction to correct the calculated rotational error;

selecting, after completion of the first correction, a larger number of alignment marks, of the alignment marks of the original, than the number of marks selected at the first detection, and executing second detection for moving the X-Y stage to place the reference mark at those positions, in sequence, which are preset in correspondence to the re-selected alignment marks, to thereby detect positional errors of the re-selected alignment marks with respect to the corresponding preset positions, respectively;

calculating a rotational error, in the $\theta$ direction, of the original with respect to the stage coordinate system by using the positional errors detected by the second detection, and executing second correction for rotationally moving the original supporting stage in the $\theta$ direction to correct the calculated rotational error; and controlling the movement of the X-Y stage for printing the pattern of the original upon the substrate, on the basis of positional deviation of the original in the X and Y directions as calculated by using the positional errors detected at the second detection.

2. An alignment method for use in an exposure apparatus for printing a pattern of an original on different zones of a substrate in sequence, said method comprising the steps of:

setting the original on an original carrying stage, wherein the original has alignment marks formed around the pattern;

positioning reference mark means at those positions, in sequence, which are preset in accordance with a stage coordinate system and in relation to the alignment marks, respectively, wherein the movement of the reference mark means is made through a substrate carrying stage adapted to move the substrate in at least one of X and Y directions in accordance with the stage coordinate system and wherein the reference mark means is provided on the substrate carrying stage;

detecting, through the sequential positioning of the reference mark means at the preset positions, a positional error of each alignment mark with respect to the reference mark means by using corresponding one of positional error detectors provided in relation to the alignment marks, respectively;

calculating a rotational error in a $\theta$ direction of the original with respect to the stage coordinate system by using the detected positional errors, and rotationally moving the original carrying stage in the $\theta$ direction so as to correct the rotational error; and moving the substrate through the substrate carrying stage in at least one of the X and Y directions in accordance with the stage coordinate system so as to print the pattern of the original on the different zones of the substrate in sequence.

3. A method according to claim 2, further comprising the steps of calculating an amount of any positional deviation of the original with respect to the stage coordinate system in at least one of the X and Y directions by using the positional errors; and, when the substrate carrying stage is moved for the printing of the pattern of the original on the substrate, using the calculated amount of positional deviation of the original for the control of the movement of the stage carrying stage in at least one of the X and Y directions.

4. A method according to claim 2, wherein said rotationally moving step comprises the step of rotationally moving the original carrying stage in the $\theta$ direction so as to correct the rotational error when the detected rotational error is greater than a predetermined tolerance, wherein said method further comprises the steps of repeating said detecting, calculating, rotationally moving, and substrate moving steps after said rotationally moving step is performed when the detected rotational error is greater than a predetermined tolerance.

5. A method according to claim 4, further comprising the step of interrupting the rotationally moving step as an error when the calculated rotational error does not become less than the predetermined tolerance even as a result of repeating the rotationally moving step.

6. An alignment method for use in an exposure apparatus for printing a pattern of an original on different zones of a substrate in sequence, said method comprising:

a setting step for setting the original on an original carrying stage, wherein the original has marks formed around the pattern;

a first detecting step for selecting particular ones of the marks comprising first-time selected masks and positioning reference mark means at those positions, in sequence, which are preset in accordance with a stage coordinate system and in relation to the first-time selected marks, respectively, to thereby detect a positional error of each of the first-time selected marks with respect to the reference mark means;

a first correcting step for calculating a rotational error of the original by using the positional errors detected at said first detecting step and rotational moving the original carrying stage so as to correct the rotational error;

a second detecting step for selecting second-time selected marks, after said first correcting step, of a number larger than that of the first-time selected marks, and positioning the reference mark means at those positions in sequence which are preset in accordance with the stage coordinate system and in relation to the second-time selected marks, respectively, to thereby detect a positional error of each of the second-time selected marks with respect to the reference mark means;

a second correcting step for calculating a rotational error of the original by using the positional errors detected at said second detecting step and rotationally moving the original carrying stage so as to correct the calculated rotational error; and moving the substrate through the substrate carrying stage in accordance with the stage coordinate system so as to print the pattern of the original on the different zones of the substrate in sequence.

* * * * *

UNITED STATES PATENT AND TRADEMARK OFFICE
CERTIFICATE OF CORRECTION

PATENT NO. : 5,142,156

DATED : August 25, 1992

INVENTOR(S) : KUNITAKA OZAWA, ET AL.

It is certified that error appears in the above-identified patent and that said Letters Patent is hereby corrected as shown below:

SHEET 6 OF THE DRAWINGS
Figure 6, "MEASUR" should read --MEASURE-- (both occurrences).

SHEET 8 OF THE DRAWINGS
Figure 8, "DEIVE" should read --DRIVE--.

COLUMN 3,
Line 13, "mask O" should read --mask θ--;
Line 21, "wy" should read --wy direction--;
Line 31, "rough-" should read --fine--; and
Line 32, "stage 10" should read --stage 8,--

COLUMN 5,
Line 17, "pattern 18" should read --pattern 418--; and
Line 37, "sage" should read --stage--.

COLUMN 7,
Line 9, "Δby" should read --Δy--
Line 36, "for" should be deleted;
Line 64, "step" should read --steps--; and
Line 65, "is" should read --are--.

UNITED STATES PATENT AND TRADEMARK OFFICE
CERTIFICATE OF CORRECTION

PATENT NO. : 5,142,156             Page 2 of 2
DATED      : August 25, 1992
INVENTOR(S): KUNITAKA OZAWA, ET AL.

It is certified that error appears in the above-identified patent and that said Letters Patent is hereby corrected as shown below:

COLUMN 8
   Line 63, "MX" should read --ΔMX--; and
   Line 64, "MY." should read --ΔMY.--

COLUMN 9
   Line 51, "mark" should read --marks--.

COLUMN 12
   Line 11, "masks" should read --marks--; and
   Line 21, "rotational" should read --rotationally--.

Signed and Sealed this

Twenty-sixth Day of October, 1993

Attest:

BRUCE LEHMAN

*Attesting Officer*     *Commissioner of Patents and Trademarks*